(12) United States Patent
Hawley et al.

(10) Patent No.: US 6,492,206 B2
(45) Date of Patent: Dec. 10, 2002

(54) ANTIFUSE WITH IMPROVED RADIATION SEDR

(75) Inventors: Frank Hawley, Campbell, CA (US); Farid Issaq, Campbell, CA (US)

(73) Assignee: Actel Corporation, Sunnyvale, CA (US)

( * ) Notice: Subject to any disclaimer, the term of this patent is extended or adjusted under 35 U.S.C. 154(b) by 42 days.

(21) Appl. No.: 09/736,897

(22) Filed: Dec. 12, 2000

(65) Prior Publication Data

US 2002/0072154 A1 Jun. 13, 2002

(51) Int. Cl.$^7$ .............................................. H01L 21/92
(52) U.S. Cl. ...................... 438/131; 434/132; 434/467; 434/600
(58) Field of Search ...................... 257/50; 438/131, 438/132, 467, 600, 601

(56) References Cited

U.S. PATENT DOCUMENTS

| 5,166,556 | A | | 11/1992 | Hsu et al. .................... 307/465 |
|---|---|---|---|---|
| 5,171,715 | A | | 12/1992 | Husher et al. ............... 437/195 |
| 5,308,795 | A | | 5/1994 | Hawley et al. .............. 437/195 |
| 5,804,500 | A | * | 9/1998 | Hawley et al. .............. 438/600 |
| 6,107,165 | A | * | 8/2000 | Jain et al. .................... 438/600 |
| 6,124,194 | A | * | 9/2000 | Shao et al. .................. 438/600 |
| RE36,893 | E | * | 10/2000 | Pramanik et al. ............. 257/50 |
| 6,249,010 | B1 | * | 6/2001 | Bergemont et al. ........... 257/50 |

* cited by examiner

Primary Examiner—Kevin M. Picardàt
(74) Attorney, Agent, or Firm—Sierra Patent Group, Ltd

(57) ABSTRACT

A metal-to-metal antifuse according to the present invention is disposed between a lower conductive electrode and an upper conductive electrode. The conductive electrodes may comprise either a barrier metal or a tungsten plug, and are each in electrical contact with a metal layer, usually a metal interconnect layer in an integrated circuit. An antifuse material is disposed between the lower and upper conductive electrodes and comprises a layer of amorphous silicon. The antifuse layer is sandwiched between two layers of silicon nitride.

3 Claims, 5 Drawing Sheets

ANTIFUSE WITH IMPROVED RADIATION SEDR

BACKGROUND OF THE INVENTION

1. Field of the Invention

The present invention relates to metal-to-metal antifuse technology. More particularly, the present invention relates to a metal-to-metal antifuse having an improved radiation single event dielectric rupture (SEDR).

2. The Prior Art

Metal-to-metal antifuses are well known in the art. These devices are usually formed between two metal interconnect layers in an integrated circuit and comprises a layer of antifuse material, usually amorphous silicon or an alloy thereof sandwiched between a pair of lower and upper conductive electrodes, each electrode in electrical contact with one of the two metal interconnect layers.

Metal-to-metal antifuses are susceptible to SEDR. A high-energy ion striking the antifuse can set up momentary conduction path in the antifuse material, which can, under certain circumstances, cause the antifuse to become inadvertently programmed. This inadvertent programming phenomenon presents a reliability issue for antifuse-based products intended for use in environments, such as space applications, where radiation is expected to be encountered.

BRIEF DESCRIPTION OF THE INVENTION

A metal-to-metal antifuse according to the present invention is disposed between a lower conductive electrode and an upper conductive electrode. The conductive electrodes may comprise either a barrier metal or a tungsten plug, and are each in electrical contact with a metal layer, usually a metal interconnect layer in an integrated circuit. An antifuse material is disposed between the lower and upper conductive electrodes and comprises a layer of amorphous silicon. The antifuse layer is sandwiched between two layers of silicon nitride.

A method for fabricating a metal-to-metal antifuse according to the present invention comprises forming a lower conductive electrode, forming a first layer of silicon nitride, forming an antifuse layer, forming a second layer of silicon nitride, and forming an upper conductive electrode.

BRIEF DESCRIPTION OF THE DRAWING FIGURES

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1:
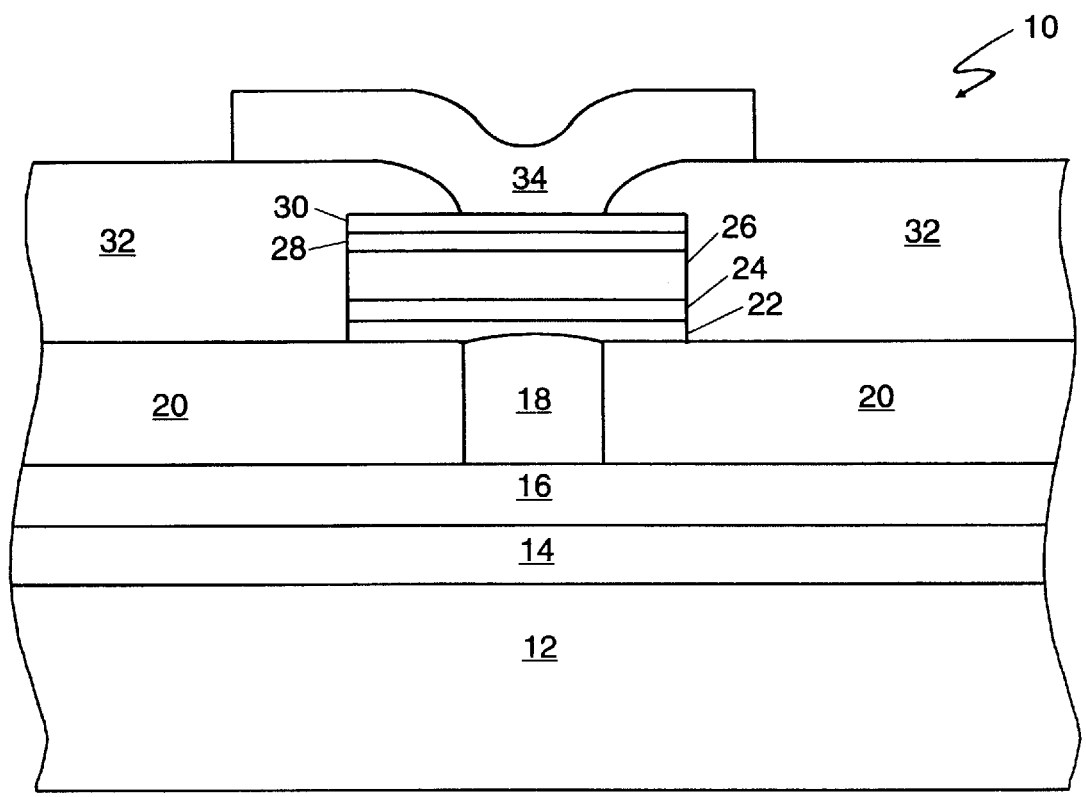
FIG. 1 is a cross-sectional view of a first illustrative antifuse according to the present invention.

Referring first to FIG. 1, a cross-sectional view shows a first illustrative antifuse 10 according to the present invention. Antifuse 10 is disposed over semiconductor substrate 12. Insulating layer 14 insulates metal interconnect layer 16 from semiconductor substrate 12 as is well known in the art. Tungsten plug 18 is disposed in a via in insulating layer 20, which may comprise a layer of silicon dioxide having a thickness of between about 400 nm and about 1,000 nm. The upper surfaces of tungsten plug 18 and insulating layer 20 are planarized. Alternatively, tungsten plug 18 may be raised above the surface of the insulating layer 20 by performing planarization using CMP techniques or by performing a plasma oxide etch after planarization.

Barrier metal layer 22 is formed over tungsten plug 18. Barrier metal layer 22 may comprise a layer of Ti having a thickness of between about 5 nm and about 20 nm, or TiN having a thickness of between about 20 nm and about 200 nm. Barrier metal layer 22 is optional and may be omitted in some embodiments of the present invention in which first silicon nitride layer 24 is formed directly over tungsten plug 18 thickness of between about 2 nm and about 10 nm. Antifuse layer 26 is disposed over first silicon nitride layer 24. Antifuse layer 26 may comprise a layer of amorphous silicon having a thickness of between about 20 nm and about 100 nm. Second silicon nitride layer 28, having a thickness of between about 2 nm and about 10 nm, is disposed over antifuse layer 26. Barrier metal layer 30 is disposed over second silicon nitride layer 28. Like barrier metal layer 22, barrier metal layer 30 may comprise a layer of TiN having a thickness of between about 20 nm and about 200 nm. The entire antifuse stack structure is covered by insulating layer 32 and metal interconnect layer 34 is electrically connected to barrier metal layer 30 through a via disposed in insulating layer 32.

Figure 2:
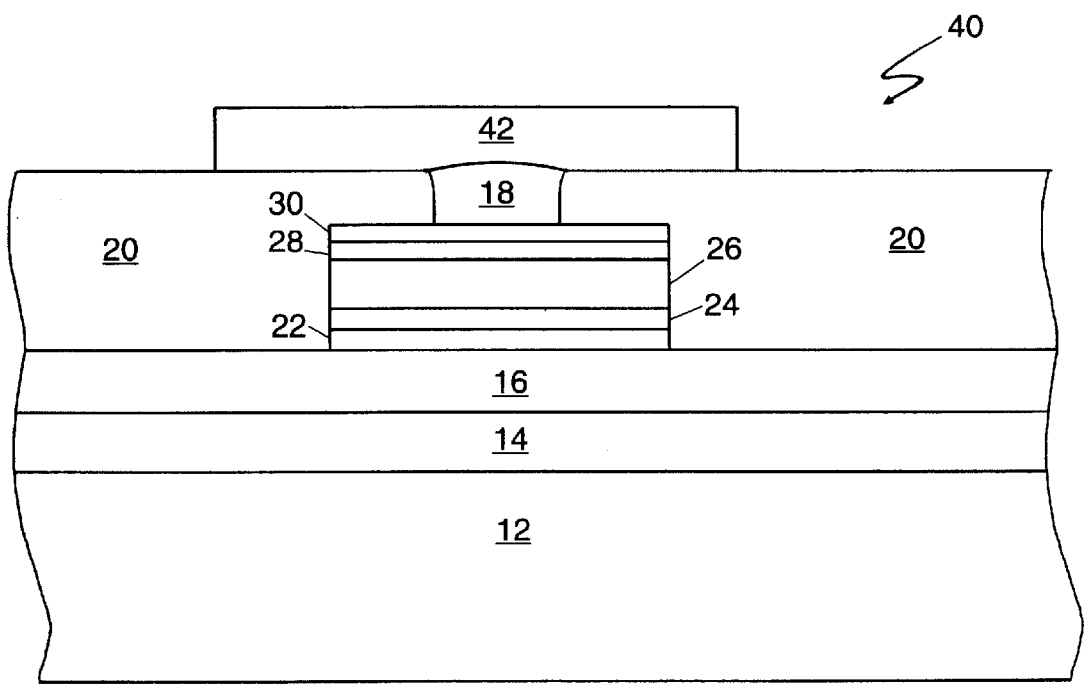
FIG. 2 is a cross-sectional view of a second illustrative antifuse according to the present invention.

Referring now to FIG. 2, a cross-sectional view shows a second illustrative antifuse 40 according to the present invention. The embodiment of FIG. 2 is similar to the embodiment illustrated in FIG. 1, and structures in the embodiment of FIG. 2 corresponding to structures in FIG. 1 will be identified by the same reference numerals. Also, unless otherwise noted, persons of ordinary skill in the art will appreciate that the materials and thicknesses of the various layers will be similar to those disclosed with respect to the embodiment of FIG. 1.

Antifuse 40 is disposed over semiconductor substrate 12. Insulating layer 14 insulates metal interconnect layer 16 from semiconductor substrate 12 as is well known in the art. Whereas in the embodiment of FIG. 1, the antifuse stack structure is disposed above tungsten plug 18, the antifuse stack in the embodiment of FIG. 2 is disposed beneath the tungsten plug 18.

Barrier metal layer 22 is formed over metal interconnect layer 16. Unlike the embodiment of FIG. 1, the presence of barrier metal layer 22 is not optional. First silicon nitride layer 24 is formed over barrier metal layer 22. Antifuse layer 26 is disposed over first silicon nitride layer 24 and second silicon nitride layer 28 is disposed over antifuse layer 26. Barrier metal layer 30 is disposed over second silicon nitride layer 28. The entire structure is covered by insulating layer 20 and tungsten plug 18 is formed in a via contacting barrier metal layer 30. In the embodiment of FIG. 2, barrier metal layer 30 is optional and may be omitted. As may be seen from an examination of both FIGS. 1 and 2, the barrier metal layer that is in contact with tungsten plug 18 is optional according to the present invention and the barrier metal that is in contact with the metal interconnect layer is always present. In the embodiment of FIG. 2, metal interconnect layer is formed over the planarized surface of insulating layer 20 and tungsten plug 18.

Figure 3A:
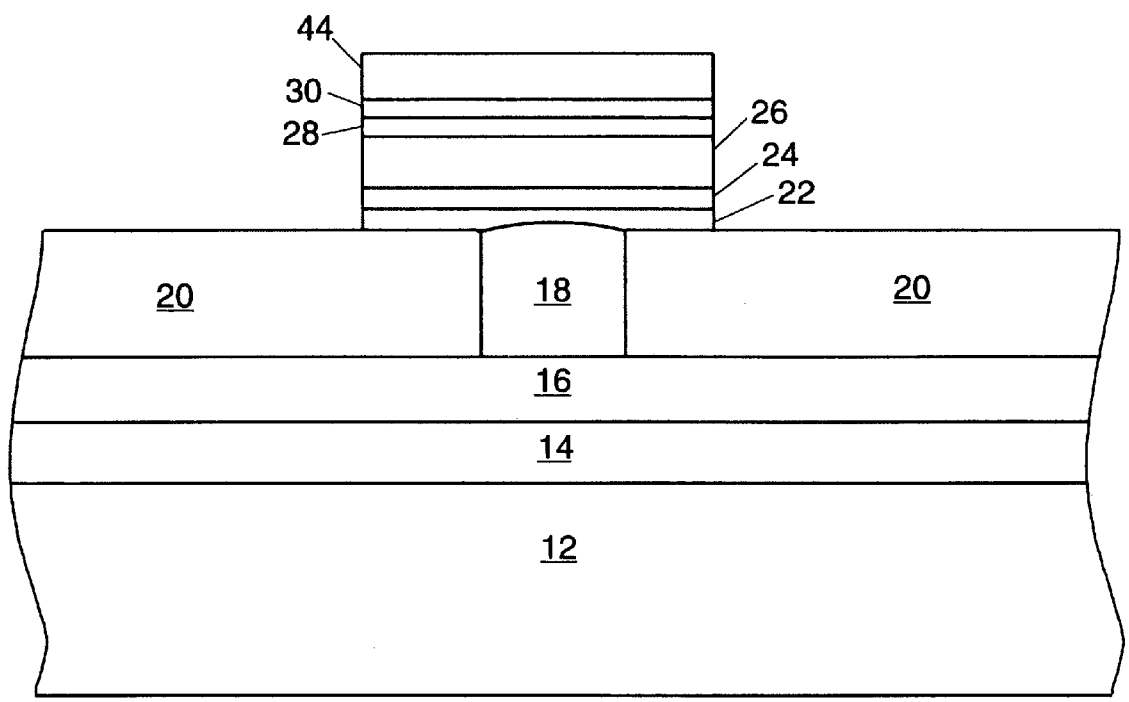
FIGS. 3A through 3C are cross-sectional views of the antifuse of FIG. 1 showing the structure existing at selected points in the fabrication process.
Figure 3B:
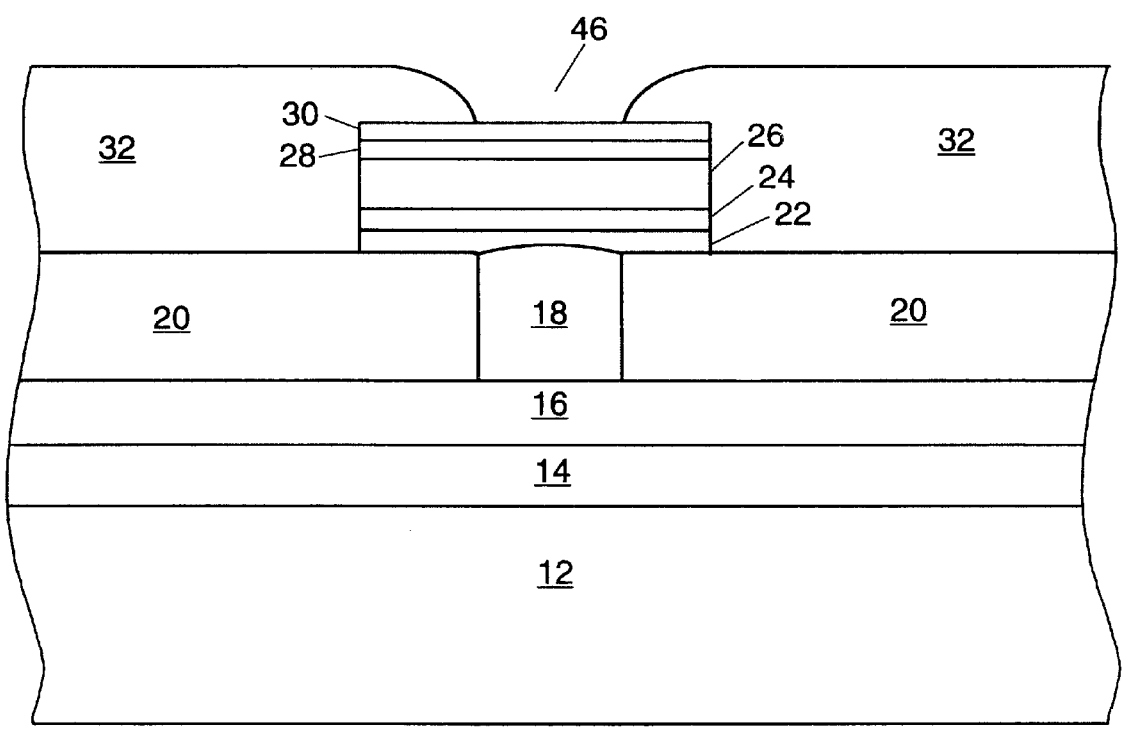
Figure 3C:
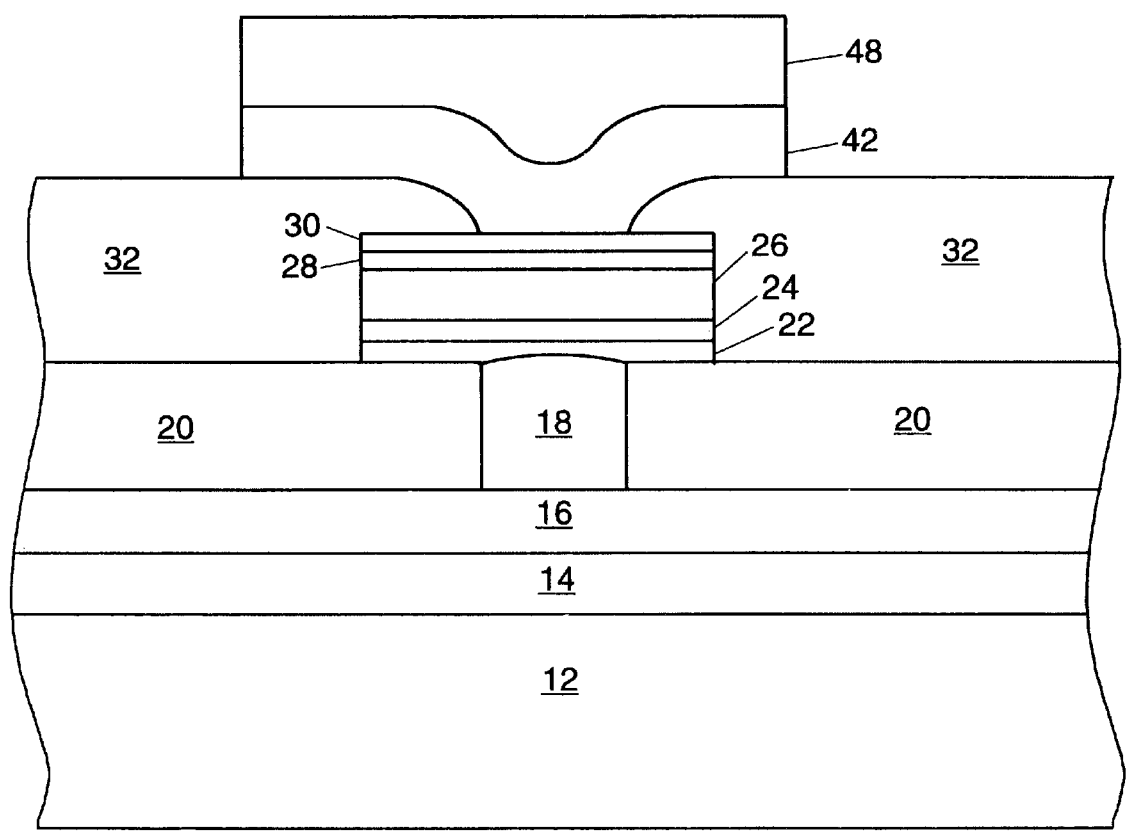

FIGS. 3A through 3C are cross-sectional views of the antifuse of FIG. 1 showing the structure existing at selected points in the fabrication process. Referring now to FIG. 3A, a conventional integrated circuit fabrication process has proceeded to the point where semiconductor substrate 12 is covered by insulating layer 14 and metal interconnect layer 16. Persons of ordinary skill in the art will recognize that other intervening layers could exist between substrate 12 and insulating layer 14 and metal interconnect layer 16, i.e., that metal interconnect layer 16 is not necessarily the first metal interconnect layer in the integrated circuit.

Insulating layer 20 is deposited, a via formed therethrough, and a tungsten plug 18 is formed therein and planarized with the top surface of insulating layer 20 as is well known in the art. Alternatively, the oxide may be recessed so that the tungsten plug 10 protrudes above the surface of insulating layer 20. The antifuse stack of the present invention is then formed by depositing the barrier metal layer 22 (which is optional), first silicon nitride layer 24, antifuse layer 26, second silicon nitride layer 28, and barrier metal layer 30. As previously noted, the barrier metal layer adjacent to the tungsten plug is optional and its presence is not necessary to practice of the present invention. FIG. 3A shows the structure remaining after a masking layer 44 has been applied and a conventional etching process has been used to define the antifuse stack comprising layers 22, 24, 26, 28, and 30.

Referring now to FIG. 3B, masking layer 44 has been removed and insulating layer 32 has been deposited. As will be appreciated by persons of ordinary skill in the art, insulating layer 32 may comprise a layer of deposited silicon dioxide. A via 46 has been formed through insulating layer 20 to expose the upper surface of barrier metal layer 30. FIG. 3B shows the structure existing after formation of via 46.

Referring now to FIG. 3C, a metal interconnect layer 42 is formed over the upper surface of insulating layer 32 and in via 46 to contact barrier metal layer 30. A masking layer 48 is formed over the metal interconnect layer 42 and a conventional metal etching step is performed to pattern the metal interconnect layer 42. FIG. 3C shows the structure existing after performance of the conventional metal etching step but prior to removal of the masking layer 48.

Persons of ordinary skill in the art will recognize that further steps, including removal of the masking layer 48 and conventional back-end steps, such as contact formation and passivation steps will be necessary to complete the integrated circuit containing antifuse 10 of FIG. 1.

Figure 4A:
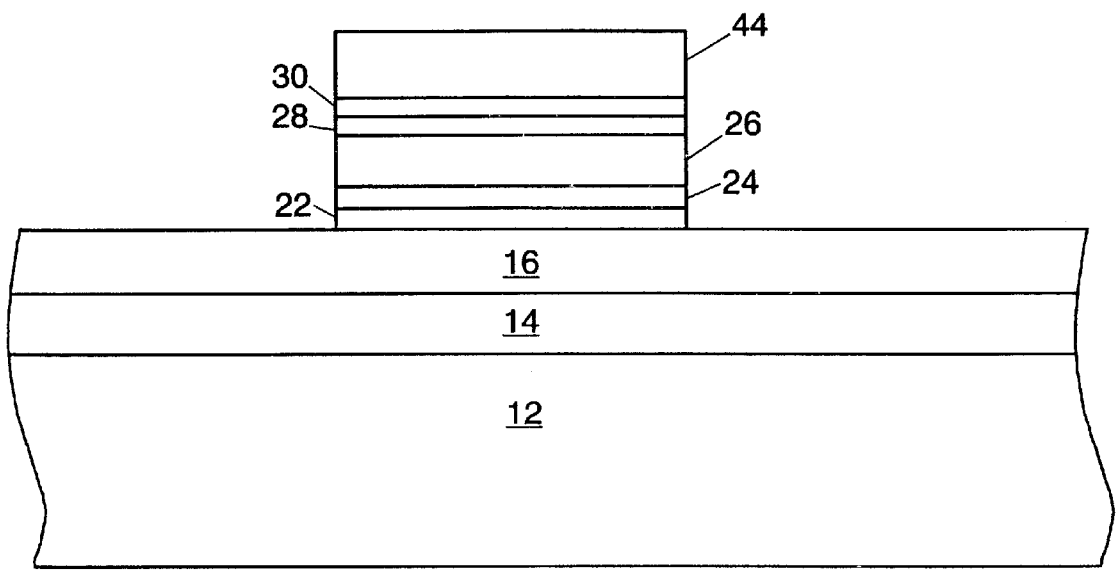
FIGS. 4A through 4C are cross-sectional views of the antifuse of FIG. 2 showing the structure existing at selected points in the fabrication process.
Figure 4B:
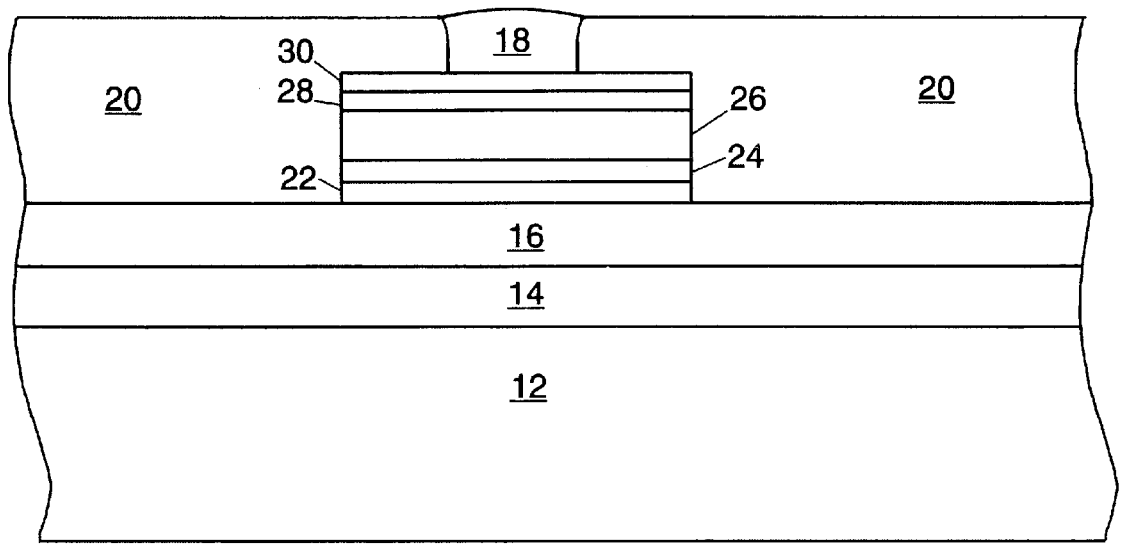
Figure 4C:
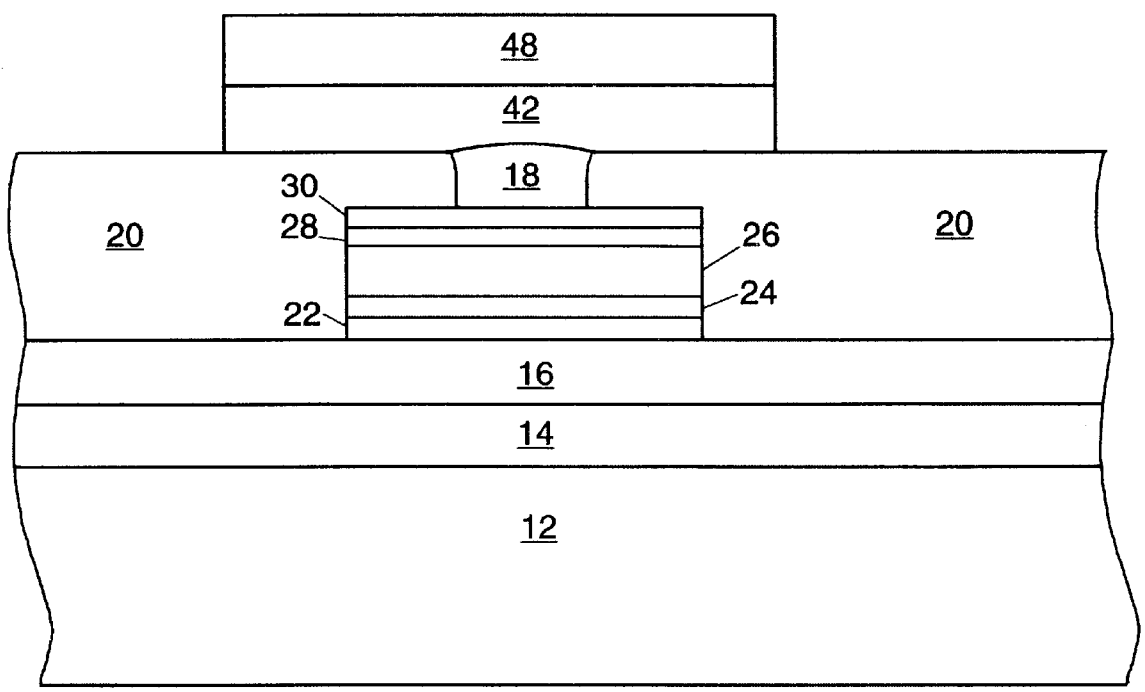

FIGS. 4A through 4C are cross-sectional views of the antifuse of FIG. 2 showing the structure existing at selected points in the fabrication process. Referring now to FIG. 4A, a conventional integrated circuit fabrication process has proceeded to the point where semiconductor substrate 12 is covered by insulating layer 14 and metal interconnect layer 16. Persons of ordinary skill in the art will recognize that other intervening layers could exist between substrate 12 and insulating layer 14 and metal interconnect layer 16, i.e., that metal interconnect layer 16 is not necessarily the first metal interconnect layer in the integrated circuit.

The antifuse stack of the present invention is then formed by depositing the barrier metal layer 22, first silicon nitride layer 24, antifuse layer 26, second silicon nitride layer 28, and barrier metal layer 30. As previously noted, the barrier metal layer 30 that will be adjacent to the tungsten plug is optional and its presence is not necessary to practice of the present invention. FIG. 4A shows the structure remaining after a masking layer 44 has been applied and a conventional etching process has been used to define the antifuse stack comprising layers 22, 24, 26, 28, and 30.

Referring now to FIG. 4B, masking layer 44 has been removed and insulating layer 20 has been deposited. As will be appreciated by persons of ordinary skill in the art, insulating layer 20 may comprise a layer of deposited silicon dioxide. A via has been formed through insulating layer 20 to expose the upper surface of barrier metal layer 30 (or second silicon nitride layer 28), tungsten plug 18 has been formed, and the tungsten plug 20 and the upper surface of insulating layer 20 have been planarized using conventional semiconductor processing techniques. FIG. 4B shows the structure existing after planarization of the tungsten plug 18 and insulating layer 20.

Referring now to FIG. 4C, a metal interconnect layer 42 is formed over the planarized surface comprising the upper surface of insulating layer 20 and tungsten plug 18. A masking layer 48 is formed over the metal interconnect layer 42 and a conventional metal etching step is performed to pattern the metal interconnect layer 42. FIG. 4C shows the structure existing after performance of the conventional metal etching step but prior to removal of the masking layer 48.

Persons of ordinary skill in the art will recognize that further steps, including removal of the masking layer 48 and conventional back-end steps, such as contact formation and passivation steps will be necessary to complete the integrated circuit containing antifuse 40 of FIG. 2.

The above-described antifuse has improved SEDR.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for operating an antifuse-based circuit in a radiation environment, comprising:

providing a circuit with at least one antifuse having:

a lower conductive electrode;

a first silicon nitride layer disposed over said lower conductive electrode;

an antifuse layer disposed over said first silicon nitride layer;

a second silicon nitride layer disposed over said antifuse layer; and an upper conductive electrode disposed over said second layer of silicon nitride; and operating said circuit in the radiation environment.

2. A method for preventing the unintentional programming of an antifuse comprising:

providing an antifuse having:

a lower conductive electrode;

a first silicon nitride layer disposed over said lower conductive electrode;

an antifuse layer disposed over said first silicon nitride layer;

a second silicon nitride layer disposed over said antifuse layer; and an upper conductive electrode disposed over said second layer of silicon nitride; and placing said antifuse in a radiation environment.

3. A method for operating a device, including antifuse-based circuits, in a radiation environment, comprising:
  providing at least one circuit with at least one antifuse having:
   a lower conductive electrode;
   a first silicon nitride layer disposed over said lower conductive electrode;
   an antifuse layer disposed over said first silicon nitride layer;
   a second silicon nitride layer disposed over said antifuse layer; and
   an upper conductive electrode disposed over said second layer of silicon nitride;
  programming at least one antifuse;
  keeping at least one other antifuse unprogrammed;
  placing said device in said radiation environment; and
  operating said device in said radiation environment, wherein said unprogrammed antifuse remains unprogrammed.

* * * * *